United States Patent
Evans et al.

(10) Patent No.: US 7,633,830 B2
(45) Date of Patent: Dec. 15, 2009

(54) REDUCED LEAKAGE DRIVER CIRCUIT AND MEMORY DEVICE EMPLOYING SAME

(75) Inventors: Donald Albert Evans, Lancaster, OH (US); Richard J. McPartland, Nazareth, PA (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 68 days.

(21) Appl. No.: 11/947,210

(22) Filed: Nov. 29, 2007

(65) Prior Publication Data

US 2009/0141580 A1    Jun. 4, 2009

(51) Int. Cl.
*G11C 8/00* (2006.01)

(52) U.S. Cl. .................. 365/230.06; 365/230.08; 365/233.11; 365/233.1

(58) Field of Classification Search ............ 365/230.06, 365/230.08, 233.11, 233.1
See application file for complete search history.

(56) References Cited

U.S. PATENT DOCUMENTS

2007/0263470 A1* 11/2007 Derner et al. ............... 365/226

* cited by examiner

*Primary Examiner*—Thong Q Le
(74) *Attorney, Agent, or Firm*—Ryan, Mason & Lewis, LLP (57) ABSTRACT

A row line driver circuit for use in a memory array including multiple memory cells and multiple row lines coupled to the memory cells for selectively accessing the memory cells includes an output stage adapted for connection to a corresponding one of the row lines and a control circuit connected to the output stage. The output stage is operative during an active phase of a given memory cycle to drive the corresponding row line to a potential as a function of at least one address signal received by the driver circuit. The control circuit is operative to generate at least one control signal for disabling the output stage at least during an inactive phase of the memory cycle to thereby substantially eliminate a leakage current path in the driver circuit.

22 Claims, 8 Drawing Sheets

REDUCED LEAKAGE DRIVER CIRCUIT AND MEMORY DEVICE EMPLOYING SAME

FIELD OF THE INVENTION

The present invention relates generally to the electrical, electronic, and computer arts, and more particularly relates to semiconductor memory devices.

BACKGROUND OF THE INVENTION

Reducing power consumption in memory devices is becoming more important, particularly in view of their growing use in mobile applications and devices, including, for example, cell phones, handheld computing devices (e.g., Blackberry® devices, a registered trademark of Research in Motion Limited), MP3 players (e.g., iPod®, a registered trademark of Apple Inc.), global positioning system (GPS) instruments, laptop and palmtop computers, etc. Leakage current in memory devices contributes significantly to standby power consumption in the memory devices. For instance, in a memory array (e.g., read only memory (ROM)) which includes a plurality of column lines and row lines, with associated row line drivers, for selectively reading one or more memory cells in the memory array, the row line drivers are responsible for a large portion of the overall leakage current due, at least in part, to the large number of driver circuits employed therein.

Memory arrays typically include row decode circuitry employing a decoder and a row line driver for driving a given row line to a logic high (e.g., "1") or a logic low (e.g., "0") voltage level in order to selectively enable read access devices associated with a corresponding row of memory cells connected to the given row line. Each row of memory cells in the memory array requires a separate row line driver to drive the access devices of the memory cells in that row. For even moderate size memory arrays, the load presented by a row line can be quite large, thereby requiring large drivers in order to achieve reasonable memory access times. Unfortunately, leakage current in the driver generally increases with the size of the driver. Moreover, as semiconductor device geometries shrink, leakage current in these devices increases, thereby exacerbating the problem. Accordingly, it is desirable to reduce leakage current in a memory row line driver circuit.

One conventional approach to reducing leakage current in a ROM is to utilize series pull-up or pull-down transistors in output stages of row line drivers in the ROM. This approach, however, results in slower memory performance due primarily to increasing rise and/or fall times of the row lines. Another approach is to employ an output stage in the row line driver having a pair of stacked p-channel metal-oxide-semiconductor (PMOS) devices connected to each row line at an intermediate node between the two devices. Specifically, a source of a first PMOS device is connected to a voltage supply of the row line driver, a drain of the first device is connected to a source of a second PMOS device at the intermediate node, a drain of the second device is connected to a voltage return of the circuit, and gates of the two devices are connected to one or more control signals. The methodology of using stacked PMOS devices, however, relies on sub-threshold leakage current to lower a voltage at the intermediate node of the PMOS stack. As a result, it takes a significant amount of time for the intermediate node to equalize to a low-current state following a row line access, which is undesirable.

Accordingly, there exists a need for techniques for reducing leakage current in a memory device which do not suffer from one or more of the above-described problems associated with conventional memory devices.

SUMMARY OF THE INVENTION

Illustrative embodiments of the present invention meet the above-noted need by providing an enhanced row line driver circuit having reduced leakage current compared to standard row line driver circuits without significantly increasing a size or degrading performance of the circuit. To accomplish this, a driver circuit in accordance with an illustrative embodiment of the invention is advantageously operative to allow a corresponding row line to which the driver circuit is connected to float during at least an inactive phase of a given memory cycle.

In accordance with one aspect of the invention, a row line driver circuit is provided for use in a memory array including multiple memory cells and multiple row lines coupled to the memory cells for selectively accessing the memory cells. The row line driver circuit includes an output stage adapted for connection to a corresponding one of the row lines and a control circuit connected to the output stage. The output stage is operative during an active phase of a given memory cycle to activate the corresponding row line as a function of a set of address signals received by the row line driver circuit. The output stage is selectively disabled at least during an inactive phase of the memory cycle as a function of at least one control signal supplied to the output stage so that a potential on the corresponding one of the row lines is undefined. The control circuit is operative to generate the control signal for disabling the output stage during the inactive phase of the memory cycle to thereby substantially eliminate a leakage current path in the row line driver circuit.

In accordance with another aspect of the invention, a memory circuit includes a plurality of memory cells, and a plurality of column lines and row lines connected to the memory cells for selectively accessing the memory cells as a function of a set of address signals supplied to the memory circuit. Each of the memory cells are associated with a unique pair of column and row lines. A decoder circuit in the memory circuit is operative to receive the set of address signals and to generate a plurality of select signals for selecting a given one of the row lines. The memory circuit further includes a plurality of row line driver circuits. Each of the row line driver circuits are connected to a corresponding one of the row lines. At least one of the driver circuits is operative during an active phase of a given memory cycle to drive the corresponding one of the row lines to a prescribed potential as a function of the set of address signals and is at least partially disabled at least during an inactive phase of the given memory cycle as a function of at least one control signal supplied to the memory circuit so that a potential on the corresponding one of the row lines is undefined.

These and other features, aspects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary methods and circuits for reducing leakage current in an embedded memory in an IC device. It is to be understood, however, that the techniques of the present invention are not limited to the methods and circuits shown and described herein. Rather, embodiments of the invention are directed to techniques for reducing the overall power consumption in a semiconductor memory device by reducing leakage current in one or more row line driver circuits in the memory device without significantly impacting performance and/or area.

A "device" as the term is used herein is intended to be broadly construed so as to encompass, by way of example only and without limitation, elements such as those commonly associated with an application-specific integrated circuit (ASIC), single inline memory module (SIMM), dual inline memory module (DIMM), content-addressable memory (CAM), central processing unit (CPU), digital signal processor (DSP), or any other type of data processing or storage device, as well as portions and/or combinations of such elements having embedded memory. A "memory" as the term is used herein is intended to be broadly construed so as to encompass any element that can be employed to at least temporarily store information (e.g., data), typically in binary form although not limited thereto, primarily nonvolatile memory (e.g., ROM and flash memory).

Although implementations of the present invention are described herein with specific reference to PMOS and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
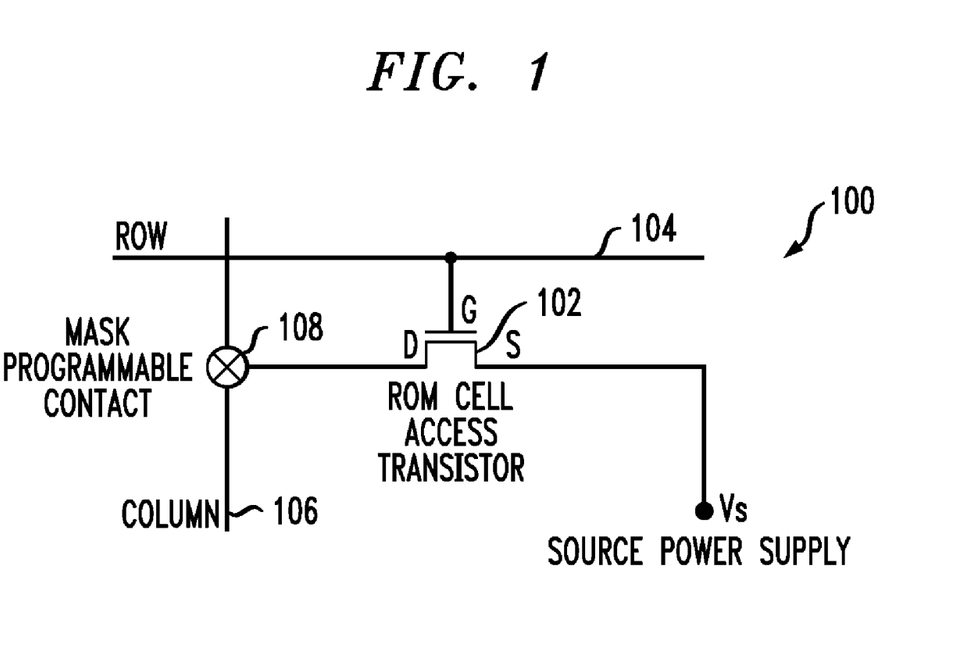
FIG. 1 is a schematic diagram depicting an exemplary ROM cell which may be employed in a ROM array.

With reference to FIG. 1, a schematic diagram of an illustrative ROM cell 100 is shown which is suitable for use in a ROM array. The illustrative ROM cell 100 includes an NMOS access transistor 102 having a source (S) connected to a source power supply, Vs, a gate (G) connected to a corresponding row line 104, and a drain (D) connected to a corresponding column line 106 by way of a mask programmable contact 108. The ROM cell 100 is programmed at manufacture by the presence or absence of the mask programmable contact 108. More particularly, if the contact 108 is present, there will be an electrical path between the column line 106 and the access transistor 102. In this case, when row line 104 is activated (e.g., brought to a high logic level, typically VDD), thereby turning on access transistor 102, conduction will occur between column line 106 and the source power supply Vs through the access transistor. The source power supply Vs is typically set to 0 volts. Prior to row activation, the column line is precharged to a prescribed voltage level, which may VDD. Conduction that occurs with row activation will decrease the column voltage from its initial precharge potential (e.g., VDD) towards the source power supply level (e.g., 0 volts). A sense amplifier (not explicitly shown) connected to the column line 106 will detect this change in column voltage thus recognizing the conductive cell as a programmed data state. The programmed data state can be defined, arbitrarily, as a logic "0" data state. Similarly, if the mask programmable contact 108 is absent during manufacture, there will be no electrical path from the corresponding column line 106 to the source supply through the associated ROM cell. In this case, when the row line 104 is activated, no change in column line potential will occur and the corresponding sense amplifier will recognize this non-conductive cell as a non-programmed data state. The non-programmed data state can be defined, arbitrarily, as a logic "1" data state.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain. It should be further appreciated that the placement of the programmable contact 108 may alternatively be place in a conduction path between the source of ROM cell access transistor 102 and the source power supply Vs.

Although shown as an NMOS transistor 102, the access device in ROM cell 100 may alternatively comprise a PMOS transistor device or a combination of PMOS and NMOS devices (e.g., complementary pass-gate). As is known in the art, NMOS transistors are conductive when a logic high level voltage, which may be VDD (e.g., 1.0 volt), is applied to their gates. Thus, in order to activate NMOS device 102, and thereby access (e.g., read) ROM cell 100, a voltage difference between the row line 104 and column line 106 or between the row line and the source power supply Vs at least equal to a threshold voltage, Vt, of the device is applied. When the row line 104 is at a logic low level, NMOS device 102 is non-conductive. Alternatively, PMOS transistors are conductive when a logic low level voltage, which may be ground (e.g., about 0 volts), is applied to their gates. When using a PMOS access device, other bias voltages would be modified accordingly, as will become apparent to those skilled in the art.

Figure 2:
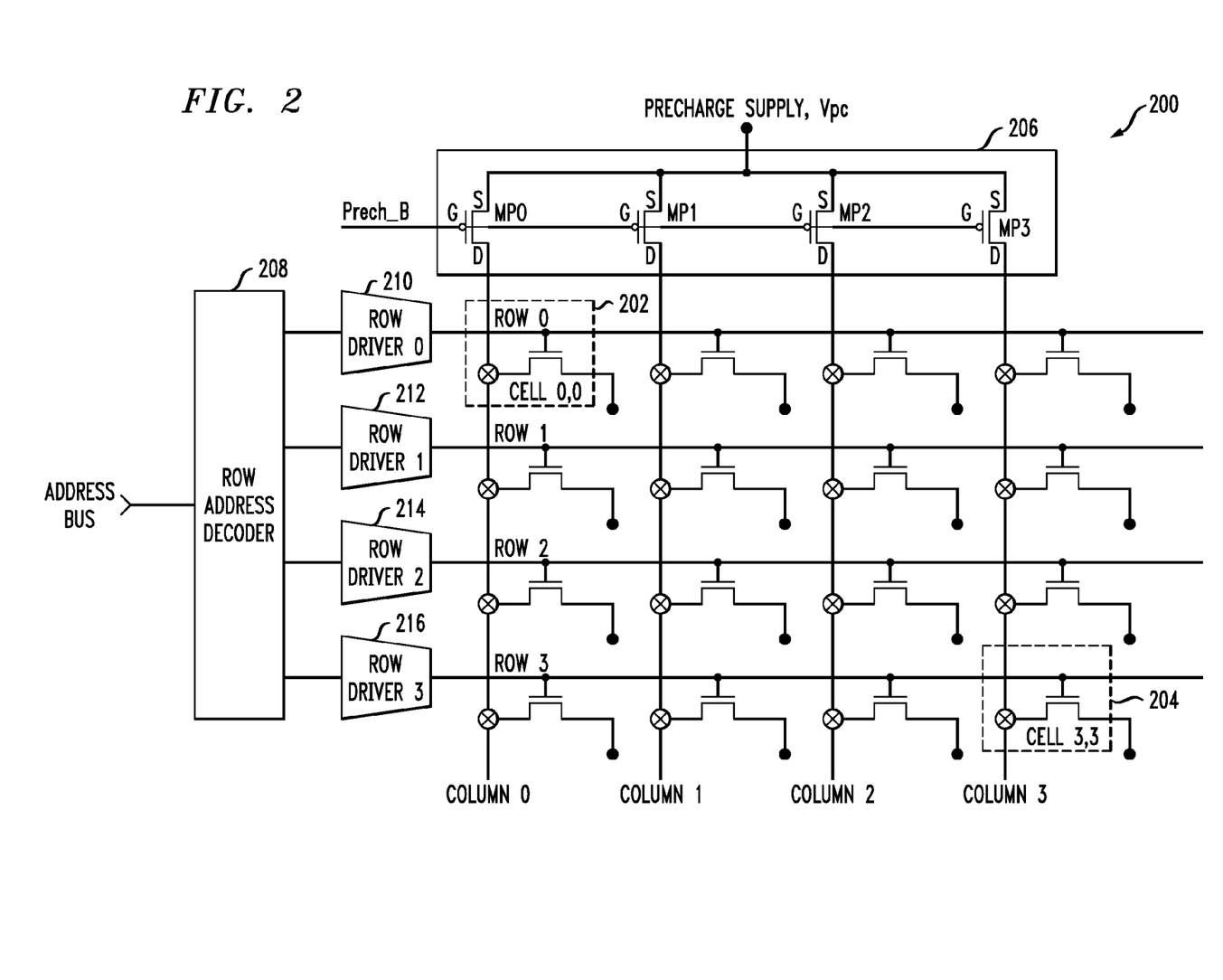
FIG. 2 is a schematic diagram depicting at least a portion of an exemplary memory circuit in which techniques of the invention may be employed.

FIG. 2 is a schematic diagram depicting at least a portion of an exemplary memory circuit 200 in which techniques of the invention may be employed. Memory circuit 200 includes a plurality of ROM cells, of which cell 202 (Cell 0,0) and cell 204 (Cell 3,3) are representative, a plurality of column lines, namely, Column 0, Column 1, Column 2 and Column 3, and a plurality of row lines, namely, Row 0, Row 1, Row 2 and Row 3. One or more of the ROM cells 202 and 204 may be configured as shown in FIG. 1. Preferably, there is a ROM cell for each unique pair of column and row lines. For example, a corresponding pair of Column 0, Row 0 is connected to Cell 0,0 and is used for selectively accessing Cell 0,0. Likewise, a corresponding pair of Column 3, Row 3 is connected to Cell 3,3 and is used for selectively accessing Cell 3,3. Thus, a given ROM cell in memory circuit 200 may be referred to as Cell x,y, where x is an integer indicative of the column line to which the given ROM cell is connected and y is an integer indicative of the row line to which the given ROM cell is connected. It is to be understood that alternative naming conventions are similarly contemplated.

Although memory circuit 200 is illustrated as a 4×4 array (e.g., four column lines and four row lines), techniques of the invention may be employed with an array of any size N×M, where N is an integer indicative of the number of column lines in the array and M is an integer indicative of the number or row lines in the array. Moreover, although the column lines and row lines in memory circuit 200 are depicted as being substantially perpendicular to one another, with the column lines being arranged in a substantially vertical direction and the row lines being arranged in a substantially horizontal direction, the invention is not limited to any particular orientation of the column lines and row lines.

Although not explicitly shown for simplification purposes, every column line or group of column lines in memory circuit 200 is preferably associated with its own dedicated sense amplifier, although alternative arrangements are contemplated. Each of the sense amplifiers is preferably adapted for reading the logic state of a selected one of the corresponding memory cells (e.g., ROM cell 0,0) connected to the corresponding column line (e.g., Column 0) and for generating an output signal indicative of the logic state read from a selected memory cell.

Each ROM cell in memory circuit 200 has a mask programmable contact programmed at manufacture. When any given row line is activated, all or a subset of the cells along that row line can be evaluated by sense amplifiers attached, either directly or indirectly (e.g., through column multiplexers), to their corresponding column lines. Each of the respective sense amplifiers is preferably operative to read a logic state of a selected ROM cell by detecting a change in potential, if any, of the corresponding column line. To accomplish this, only one row line is activated at any given time. Column lines can be precharged during a precharge or other inactive phase of a given memory cycle, between row activations. Row activation, signal development on the columns, and sense amplifier detection occur during an active phase of the memory cycle.

The column lines in memory circuit 200 are precharged to a prescribed voltage, namely, a precharge supply voltage level, Vpc, via a precharge circuit 206. Precharge circuit 206 preferably includes a plurality of transistor devices, each transistor device selectively connecting to a corresponding column line to the precharge supply voltage Vpc as a function of at least one control signal, Prech_B. Specifically, precharge circuit 206 includes a first PMOS device, MP0, a second PMOS device, MP1, a third PMOS device, MP2, and a fourth PMOS device, MP3. Sources of devices MP0, MP1, MP2 and MP3 are connected to the precharge supply voltage Vpc, gates of devices MP0, MP1, MP2 and MP3 are preferably adapted for receiving control signal Prech_B, and drains of each of the devices MP0, MP1, MP2 and MP3 are connected to corresponding column lines Column 0, Column 1, Column 2 and Column 3, respectively. It is to be understood that alternative circuit arrangements for precharging the column lines are similarly contemplated, as will become apparent to those skilled in the art given the teachings herein. Precharge circuit 206 is preferably adapted to establish a potential on each of the column lines of a prescribed voltage level Vpc as a function of control signal Prech_B supplied to the precharge circuit. The precharge voltage level is provided by the precharge supply, which may be generated internally with respect to precharge circuit 206, or supplied externally to the precharge circuit.

Memory circuit 200 further includes a row address decoder 208 operative to determine which one of the row lines (e.g., Row 0, Row 1, Row 2, or Row 3) is to be activated during the active phase of a particular memory cycle. Row address decoder 208 includes at least one control input for receiving one or more address signals (Address Bus), or other control signals, and a plurality of outputs generating respective select signals for selecting one of the row lines. When a plurality of address signals are employed, as may be supplied, for example, by an address bus (as shown), the row address decoder 208 will comprise a plurality of control inputs accordingly. Row address decoder 208 may comprise, for example, a multiplexer or alternative switching circuitry.

Each of the respective outputs of the row address decoder 208 is preferably connected to a corresponding row line via a corresponding row line driver circuit. More particularly, a first output of row address decoder 208 is connected to an input of a first row line driver circuit (Row Driver 0) 210 and an output of the first row line driver circuit is adapted for connection to corresponding row line Row 0. A second output of row address decoder 208 is connected to an input of a second row line driver circuit (Row Driver 1) 212 and an output of the second row line driver circuit is adapted for connection to corresponding row line Row 1. A third output of row address decoder 208 is connected to an input of a third row line driver circuit (Row Driver 2) 214 and an output of the third row line driver circuit is adapted for connection to corresponding row line Row 2. A fourth output of row address decoder 208 is connected to an input of a fourth row line driver circuit (Row Driver 3) 216 and an output of the fourth row line driver circuit is adapted for connection to corresponding row line Row 3. Only one of the plurality of output lines of the row address decoder 208 is preferably activated at any given time, as a function of the address signals.

In the case of a 4×4 ROM array, as shown in FIG. 2, the row address decoder 208 determines which one of the four rows is to be activated during the active phase of a given memory cycle. An active signal generated by one of the outputs of the row address decoder 208 activates the corresponding row driver. The activated row driver in turn activates its corresponding row line by driving a voltage level on the row line to an active state (e.g., logic high level). In this example, using NMOS access transistors in each ROM cell, a selected row line is driven to a logic high level, typically VDD, to become active. All other non-selected row lines preferably remain at an inactive level, in this exemplary case, a logic low level, typically 0 volts. It is to be appreciated that the invention is not limited to any particular voltage levels for an active or an inactive row line.

During the inactive phase of the memory cycle, the column lines are precharged to the precharge supply voltage level, typically VDD. The column lines should remain at this precharge voltage level until a row line is activated. So as not to change the potential on the column lines during the inactive (e.g., precharge) phase of the memory cycle, all row lines are preferably held at the inactive voltage level, typically 0 volts.

The inactive phase of the memory cycle does not necessarily represent 50 percent of the memory cycle, although it can be. The memory circuit 200 may be operated in a continuous manor and at cycle times as short as specifications will allow. In this case, the inactive phase of the memory cycle may be a constant fixed percentage of the memory cycle. For some ROM designs, this could be near 50 percent of the memory cycle. Typically, ROMs are not always operated in a continuously accessed manor. Often, there may be a few or a burst of many read accesses followed by a relatively long period of inactivity. This period of inactivity is generally contained in the inactive phase of a memory cycle and may be many times longer than the active phase of the memory cycle. This period of inactivity of the memory circuit 200 is sometimes referred to as being in standby mode. Standby mode may last from very short to very long periods of time, typically from the time corresponding to at least one memory cycle, which may be as short as a few nanoseconds, to many hours or even days. During standby mode, low leakage current is of particular significance.

During the active phase of the memory cycle, the row address decoder 208 selects which row line to activate based primarily upon the address signals supplied to the decoder. Each row line has an associated row driver, as described above. During the active phase of the memory cycle, one row driver corresponding to one or more selected ROM cells will be activated by the row address decoder 208 while all the other row drivers will be held in the inactive state. The active row driver drives its corresponding row line to an active level, typically VDD when NMOS access transistors are employed in the ROM cells. The deactivated row drivers hold their corresponding row lines at the inactive level, typically 0 volts when NMOS access transistor are employed in the ROM cells. Thus, for all row drivers, their respective outputs are driven to either an active level (e.g., VDD) or an inactive level (e.g., 0 volts).

During the inactive phase of the memory cycle, all row drivers will have their respective outputs at the inactive level (typically 0 volts), thereby holding all row lines to their non-selected potentials (typically 0 volts). Table 1 below summarizes illustrative row line and column line bias voltage levels in the memory circuit 200 as a function of row selection, memory phase and cell programmed state during an exemplary memory cycle. Corresponding data detected by a sense amplifier associated with the column line is also shown. The present invention, however, is not limited to the specific voltage levels shown.

Sub-threshold leakage current through a MOS transistor is often defined as an undesirable current that flows between the source and drain of the transistor when the transistor is biased in a non-conductive state. Typically, leakage current is substantially smaller than the current that flows between the source and drain of the transistor when the transistor is biased in a conductive state. Unfortunately, sub-threshold leakage current in a transistor generally increases with the current drive of the transistor, which is a function of certain geometries of the transistor (e.g., channel width), and temperature. Moreover, as semiconductor device geometries shrink, leakage current in these devices increases, thereby exacerbating the problem. Given the large number of row drivers typically employed in a memory device, the overall leakage current in the device can be significant. For example, a large ROM may include 1024, 2048, 4096 or more row lines, with an equal number of corresponding row drivers. Due at least in part to the large number of row drivers, the relatively large row driver output stage transistor widths, and the increased sub-threshold leakage current in modern semiconductor process technologies, the sub-threshold leakage current through the sum of all the row driver output stages can be large and a significant portion (e.g., up to about 40 percent) of the overall leakage current in the memory circuit.

Figure 3:
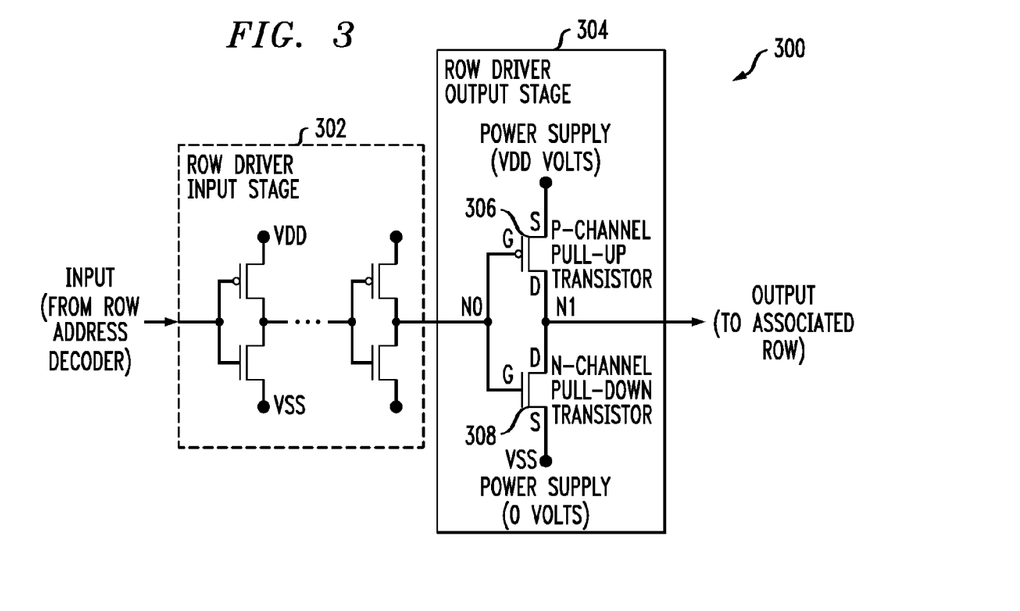
FIG. 3 is a schematic diagram depicting an exemplary row driver circuit which can be modified to implement techniques of the present invention.

FIG. 3 is a schematic diagram depicting an exemplary row driver circuit 300 which can be modified to implement techniques of the present invention. Row driver circuit 300 includes an input stage 302 operative to receive an input signal supplied thereto, and an output stage 304 connected to the input stage and operative to generate an output signal for driving an associated row line. Input stage 302 may include a plurality of inverters connected together in series, although other input stage configurations are contemplated. The invention is not limited to any particular number of inverters employed in the input stage 302. Output stage 304 may comprise an inverter having a PMOS transistor device 306 and an NMOS transistor device 308 connected together in a conventional fashion. Specifically, a source of device 306 is connected to a first voltage supply, which may be VDD, drains of device 306 and device 308 are connected together and form an output of row driver circuit 300 at node N1, a source of device 308 is connected to a second voltage supply, which may be VSS (e.g., 0 volts), and gates of devices 306 and 308 are connected together and form an input of the output stage 304 at node N0.

PMOS device 306 forms a pull-up path in the driver circuit 300 which is operative to drive the associated row line to a logic high level as a function of the input signal supplied to the driver circuit. Likewise, NMOS device 308 forms a pull-down path in the driver circuit 300 which is operative to drive the associated row line to a logic low level as a function of the input signal supplied to the driver circuit. Devices 306 and 308 are preferably sized, at least in terms of a ratio of channel width to channel length of the devices, so as to drive the associated row line to its appropriate level within prescribed rise and fall times. Moreover, PMOS and NMOS devices forming the inverters in input stage 302 are preferably sized so as to efficiently driver the output stage devices 306 and 308. Various techniques for efficiently sizing the inverters in input stage 302 so as to minimize reflections, including the use of ratio scaling, are known by those skilled in the art.

TABLE 1

| Row | Memory Cycle Phase | ROM cell Programmed State | Row Voltage | Column Voltage | Sense Amplifier Data Detected |
|---|---|---|---|---|---|
| All | Inactive | Conductive | 0 | VDD | N/A |
| Selected | Active | Conductive | VDD | Lowered | 0 |
| Non-selected | Active | Conductive | 0 | N/A | N/A |
| All | Inactive | Non-conductive | 0 | VDD | N/A |
| Selected | Active | Non-conductive | VDD | VDD | 1 |
| Non-selected | Active | Non-conductive | 0 | N/A | N/A |

In row driver circuit 300, one device (e.g., PMOS device 306) in output stage 304 is conductive and the other device (e.g., NMOS device 308) is non-conductive. For non-selected row lines during the active phase of a given memory cycle and for all row lines during the inactive phase of the cycle, the NMOS pull-down device 308 is conductive (turned on) and the PMOS pull-up device 306 is non-conductive (turned off). For the activated or selected row line during the active phase of the memory cycle, the PMOS pull-up device 306 is conductive and the NMOS pull-down device 308 is non-conductive. This is shown in Table 2 below.

TABLE 2

| Row | Memory Cycle Phase | PMOS pull-up transistor | NMOS pull-down transistor | Row Voltage |
| --- | --- | --- | --- | --- |
| All | Inactive | Non-conductive | Conductive | 0 |
| Selected | Active | Conductive | Non-conductive | VDD |
| Non-selected | Active | Non-conductive | Conductive | 0 |

During the inactive phase of the memory cycle or when a row line is non-selected, the PMOS pull-up device in the driver output stage will be non-conductive and NMOS pull-down device will be conductive, thereby driving the associated row line to a logic low potential (e.g., 0 volts), as previously stated. In this instance, there will be a relatively large difference in potential between a drain of the non-conductive PMOS device 306 and its source, which is connected to VDD. Consequently, a leakage current path will exist through the PMOS device. In order to reduce this leakage path, one or more series transistors can be added in the pull-up path, between the row line and VDD (e.g., in series with PMOS device 306 in the row driver output stage 304).

Figure 4:
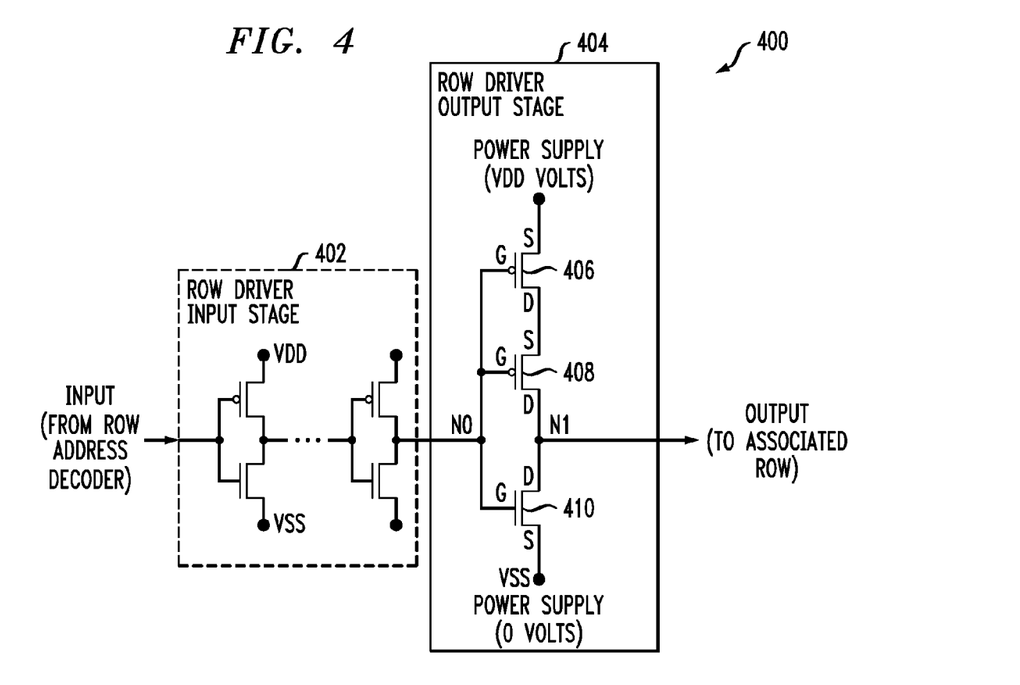
FIG. 4 is a schematic diagram depicting an exemplary row driver circuit having reduced leakage current compared to the row driver circuit shown in FIG. 3.

FIG. 4 is a schematic diagram depicting an exemplary row driver circuit 400 having reduced leakage current compared to the row driver circuit 300 shown in FIG. 3. Like row driver circuit 300, row driver circuit 400 includes an input stage 402 and an output stage 404 connected to the input stage. Input stage 402 may be the same as input stage 302 shown in FIG. 3. Output stage 404, however, has been modified compared to the output stage 304 shown in FIG. 3 in that a second PMOS has been added to the series pull-up path. Specifically, output stage 404 comprises a first PMOS transistor device 406, a second PMOS transistor device 408, and an NMOS transistor device 410 configured such that a source of device 406 is connected to a first voltage supply, which may be VDD (e.g., 3.0 volts), a drain of device 406 is connected to a source of device 408, a drain of device 408 is connected to a drain of device 410 and forms an output of the row driver circuit 400 at node N1, a source of device 410 is connected to a second voltage supply, which may be VSS (e.g., 0 volts), and gates of devices 406, 408 and 410 are connected together and form an input of the output stage 404 at node N0. The output of row driver circuit 400 is adapted for connection to an associated row line.

PMOS devices 406 and 408 form a pull-up path in the driver circuit 400 which is operative to drive the associated row line to a logic high level as a function of the input signal supplied to the driver circuit. Likewise, NMOS device 410 forms a pull-down path in the driver circuit 400 which is operative to drive the associated row line to a logic low level as a function of the input signal supplied to the driver circuit. When the row line is held in the inactive state (e.g., 0 volts), the leakage current through the driver output stage is reduced because the source to drain voltage across at least one of the PMOS devices 406 and 408 will be less than that across the single pull-up PMOS device 306 in the driver circuit 300 of FIG. 3. PMOS device 408 effectively has additional back-gate bias, and the gate voltage of device 408 will be below its source voltage.

One drawback of the output stage configuration shown in FIG. 4 is that row activation (pull-up) will be substantially slower than the output stage arrangement in the row driver circuit 300 depicted in FIG. 3 primarily because a composite gain of the series PMOS devices 406 and 408 in row driver circuit 400 is approximately one-half that of a single device of the same size. Moreover, parasitic and gate capacitances on the input to the driver output stage 404 at node N0 will be increased compared to the output stage 304 shown in FIG. 3 due mainly to the additional PMOS pull-up device. This slows down both row activation and deactivation. If the sizes of the series pull-up devices 406 and 408 are increased to increase their gain, the capacitance at node N0 will increase further. Slower row activation and/or deactivation reduces memory speed performance and is therefore undesirable.

The present invention reduces overall leakage (standby) current in a memory circuit by providing a modified output stage configuration for row driver circuits employed in the memory circuit. More particularly, illustrative embodiments of the invention beneficially turn off both a PMOS pull-up transistor device and an NMOS pull-down transistor device during at least a substantial portion of the inactive phase of a given memory cycle; this includes prolonged inactive phases of the memory cycle when the memory circuit is in standby mode. This effectively breaks an electrical path for leakage current between a voltage supply, which may be VDD (e.g., 1.0 volt), and a current return, which may be ground (e.g., 0 volts), in the row driver circuit, thereby greatly reducing sub-threshold leakage current flowing through the output stage in the row driver circuit. Thus, at least during the inactive phase of the memory cycle, a row line driver circuit incorporating techniques of the invention will be in a tri-state mode of operation, whereby the corresponding row line connected to the driver circuit will essentially float so that a potential on the row line is uncontrolled (e.g., undefined).

Figure 5:
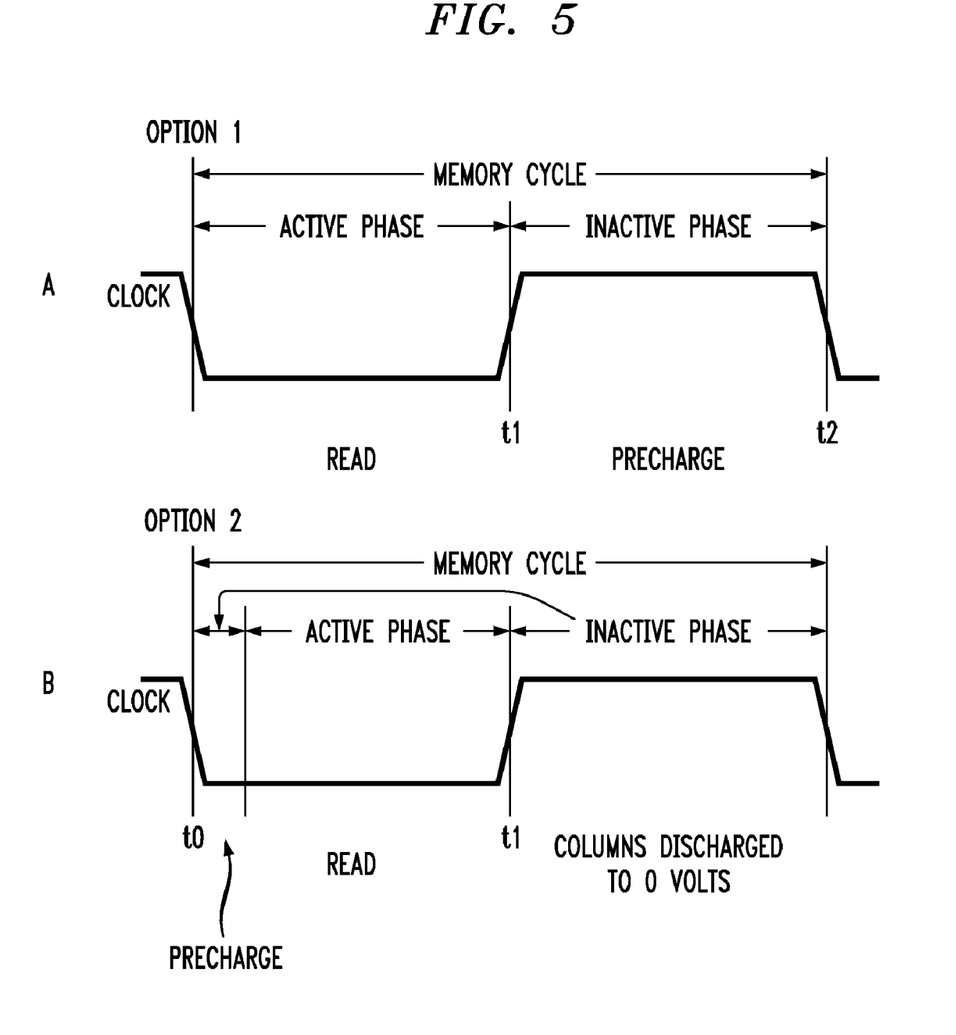
FIGS. 5A and 5B illustrate exemplary precharge timing options in a given memory cycle which may be employed in connection with the invention.

With reference to FIGS. 5A and 5B, two exemplary precharge timing options in a memory circuit are shown. In a first precharge timing option (Option 1) depicted in FIG. 5A, precharge starts at the end of an active phase of a memory cycle (e.g., at time t1). In this option, the column lines in the memory circuit are preferably held at a precharge voltage level during substantially the entire inactive phase. In a second precharge timing option (option 2) depicted in FIG. 5B, precharge starts at the beginning of the memory cycle, immediately before the active (read) phase (e.g., at time to). In this option, all column lines are preferably discharged to 0 volts at the beginning of the inactive phase (e.g., at time t1). It is to be understood that the invention may be used with other timing options, as will become apparent to those skilled in the art given the teachings herein.

Figure 6:
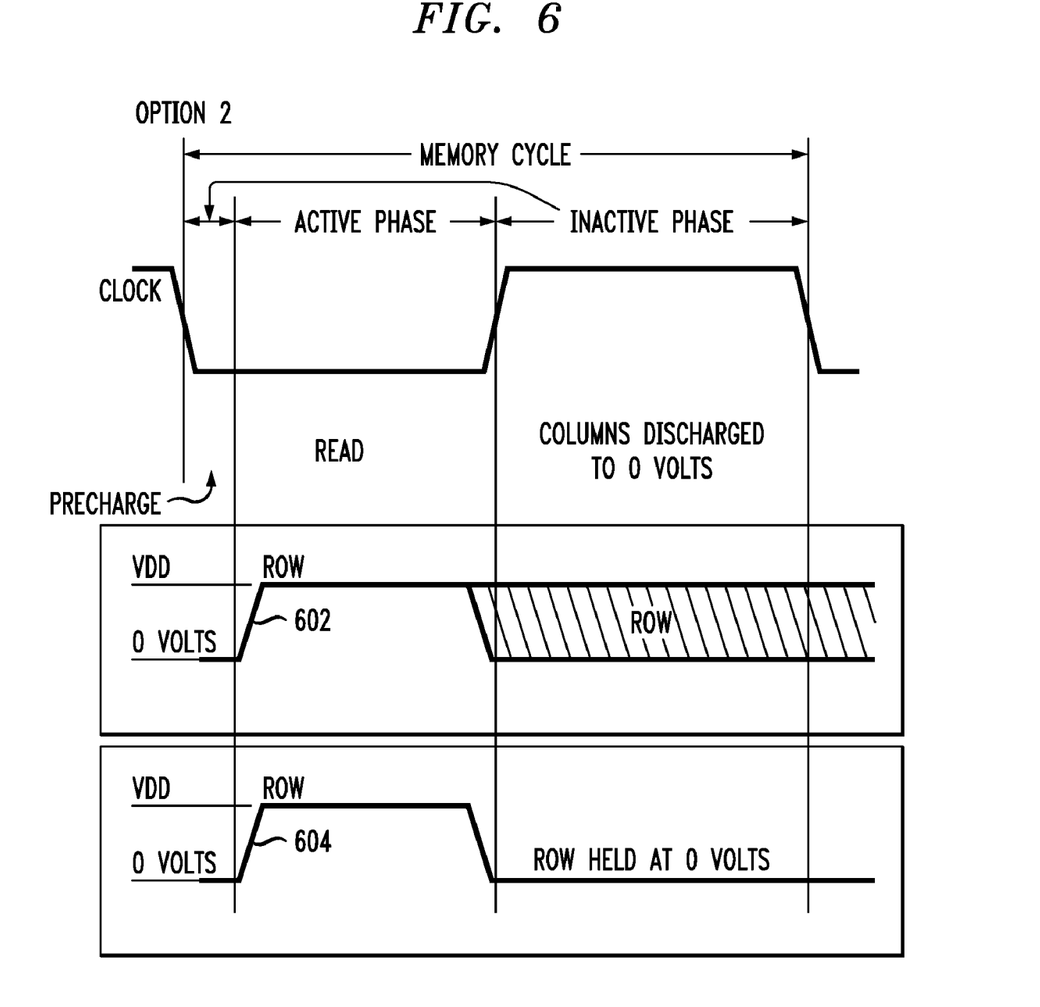
FIG. 6 illustrates exemplary row voltages during a given memory cycle for two embodiments of the row driver circuit, in accordance with an aspect of the invention.

Advantages of the invention are perhaps more easily recognized as applied to the second timing option, wherein the column lines are discharged to 0 volts during the inactive phase of the memory cycle. FIG. 6 illustrates exemplary row voltages during a given memory cycle for two embodiments of the row driver circuit, in accordance with an aspect of the invention. As depicted in graph 602, during most of the inactive phase, the row line potential is floating rather than being held at 0 volts as in graph 604, which is representative of the row driver circuits 300 and 400 shown in FIGS. 3 and 4, respectively. With regard to graph 602, the floating row voltage which occurs during a substantial portion of the inactive phase of the memory cycle is a result of the row line not being driven by the corresponding row driver circuit.

As previously explained, a row driver circuit in accordance with an illustrative embodiment of the invention includes an output stage in which both the pull-up and pull-down transistor devices are non-conductive at least during a substantial portion of the inactive phase of the memory cycle. Without a pull-up or a pull-down path to drive the associated row line to a defined potential, a voltage level of the corresponding row line connected to the row driver circuit will float. In timing option 2, with the column lines discharged to 0 volts, both sides of all access transistors in the ROM cells in the ROM array are preferably at ground potential during the time that the row lines are floating. For this reason, the floating row lines will not cause any current to flow in any of the cells even when the potential on a given row line is of a sufficient level to turn on the access transistors connected thereto. In other embodiments of the memory circuit wherein the column lines are at a logic high level (e.g., VDD) during the inactive phase of the memory cycle, the source voltage supply connected to the respective sources of the access transistors can be set to the same logic high level to thereby prevent current flow through the access transistors. Therefore, regardless of the voltage levels on the column lines, the memory circuit is preferably configured such that the potentials on both sides (e.g., source and drain) of the access transistors in the ROM cells are ideally the same.

Figure 7:
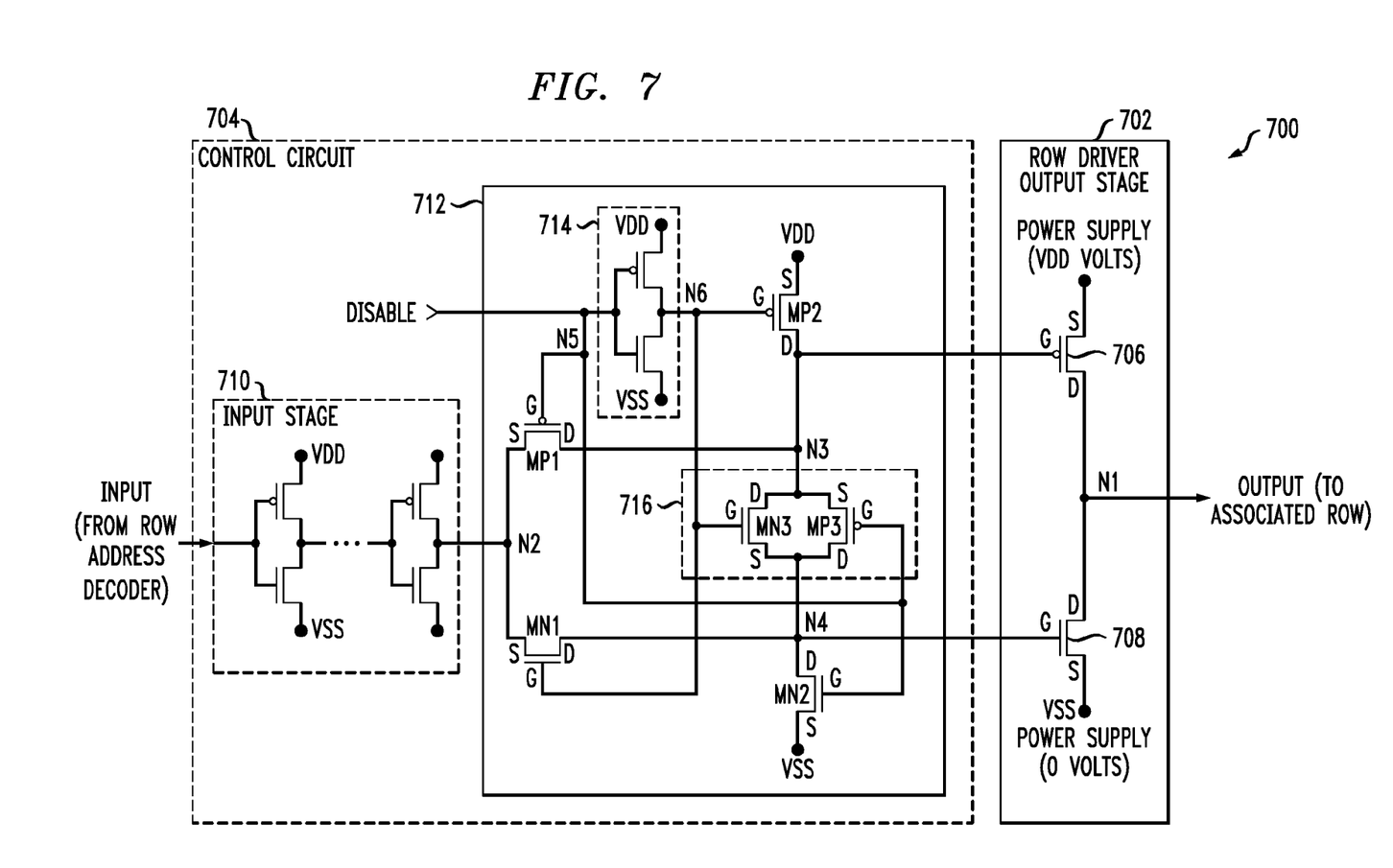
FIG. 7 is a schematic diagram depicting at least a portion of an exemplary row driver circuit, in accordance with an embodiment of the invention.

FIG. 7 is a schematic diagram depicting at least a portion of an exemplary row line driver circuit 700, in accordance with an embodiment of the invention. Row line driver circuit 700 comprises an output stage 702 and a control circuit 704 connected to the output stage. The output stage 702 includes at least first and second transistor devices connected to an output of the driver circuit, the output being adapted for connection to a corresponding one of the row lines. The first transistor device is connected in a pull-up path of the driver circuit and the second transistor device is connected in a pull-down path of the driver circuit. The control circuit 704 is operative at least during an inactive phase of a given memory cycle to bias the first and second transistor devices in a non-conductive state at substantially the same time to thereby eliminate a leakage current path in the driver circuit.

More particularly, output stage 702 includes a first PMOS transistor device 706 forming the pull-up path in the driver circuit 700 and a first NMOS transistor device 708 forming the pull-down path in the driver circuit. A source of device 706 is adapted for connection to a first voltage supply, which may be VDD (e.g., 1.0 volt), a drain of device 706 is connected to a drain of device 708 and forms the output of driver circuit 700 at node N1, a source of device 708 is adapted for connection to a second voltage supply, which may be VSS (e.g., 0 volt). A gate of device 706 is adapted to receive a first control signal and a gate of device 708 is adapted to receive a second control signal, the first and second control signals selectively activating devices 706 and 708, respectively. Device 706 is operative to drive the associated row line to a logic high level as a function of the input signal supplied to the driver circuit. Likewise, device 708 is operative to drive the associated row line to a logic low level as a function of the input signal supplied to the driver circuit. Devices 706 and 708 are preferably sized (e.g., by adjusting a ratio of channel width to channel length of the devices) so as to drive the corresponding row line to its appropriate level within prescribed rise and fall times.

Control circuit 704 comprises an input stage 710 and a disable circuit 712 connected to the input stage. Input stage 710 may include a plurality of inverters connected together in series, although other input stage configurations are contemplated. The invention is not limited to any particular number of inverters employed in the input stage 710. Input stage 710 is operative to receive a select signal from a row address decoder (e.g., 208 in FIG. 2) or alternative decode circuitry in a memory array in which driver circuit 700 is used, and to generate a buffered select signal which is indicative of the input select signal. The buffered select signal generated by input stage 710 may be either a non-inverting or an inverting version of the select signal, depending on the number of inverter stages employed in the input stage.

Disable circuit 712 is preferably adapted to receive the buffered select signal generated by input stage 710 and to generate the first and second control signals as a function thereof. The first and second control signals are preferably configured, at least during a substantial portion of the inactive phase of the memory cycle, to bias devices 706 and 708 in a non-conductive state at substantially the same time, as previously explained. To accomplish this, disable circuit 712 includes a first PMOS device MP1 and a first NOS device MN1, sources of devices MP1 and MN1 are connected together and form an input of the disable circuit at node N2 for receiving the buffered select signal, a drain of device MP1 generates the first control signal at node N3, and a drain of device MN1 generates the second control signal at node N4. A gate of device MP1 is adapted to receive a Disable signal at node N5 and a gate of device MN1 is adapted to receive a logical complement of the Disable signal at node N6. The logical complement of the Disable signal may be generated by an inverter 714, or alternative inverting circuitry. Inverter 714 may include a PMOS device and an NMOS device connected together in a conventional manner, as shown.

The disable circuit 712 further comprises a second PMOS device MP2 and a second NMOS device MN2 connected in series through a pass gate 716. Specifically, a source of device MP2 is adapted for connection to the first voltage supply, which may be VDD, a drain of MP2 is connected to a first node of pass gate 716 at node N3, a drain of device MN2 is connected to a second node of pass gate 716 at node N4, and a source of MN2 is adapted for connection to the second voltage supply, which may be VSS. Pass gate 716 may include a third PMOS device MP3 and a third NMOS device MN3. A drain of device MN3 is connected to a source of device MP3 at node N3, a source of MN3 is connected to a drain of MP3 at node N4, a gate of MP3 is connected to node N5 for receiving the Disable signal, and a gate of MN3 is connected to node N6 for receiving the logical complement of the Disable signal.

When the Disable signal applied to the control circuit 704 is a logic low level, as may occur during an active phase of the memory cycle, pass gate 716 will be turned on, thereby electrically connecting node N3 to node N4. With nodes N3 and N4 connected together, a pass gate formed by devices MP1 and MN1 will be turned on, thereby passing the buffered select signal at node N2 directly to the gates of devices 706 and 708 in output stage 702. Devices MP2 and MN2 will be turned off and will thus have no effect on the first and second control signals, which will be the same as the buffered select signal at node N2. When the Disable signal is a logic high level, as may occur during an inactive phase of the memory cycle, devices MP1 and MN1 will be turned off and pass gate 716 will be disabled. Devices MP1 and MN1 being turned off effectively breaks a signal path between the input stage 710 and the output stage 702. Additionally, devices MP2 and MN2 will be turned on. With device MP2 turned on, the first control signal will be a logic high level, thereby turning off device 706. Concurrently, with device MN2 turned on, the second control signal will be a logic low level, thereby turning off device 708.

Figure 8:
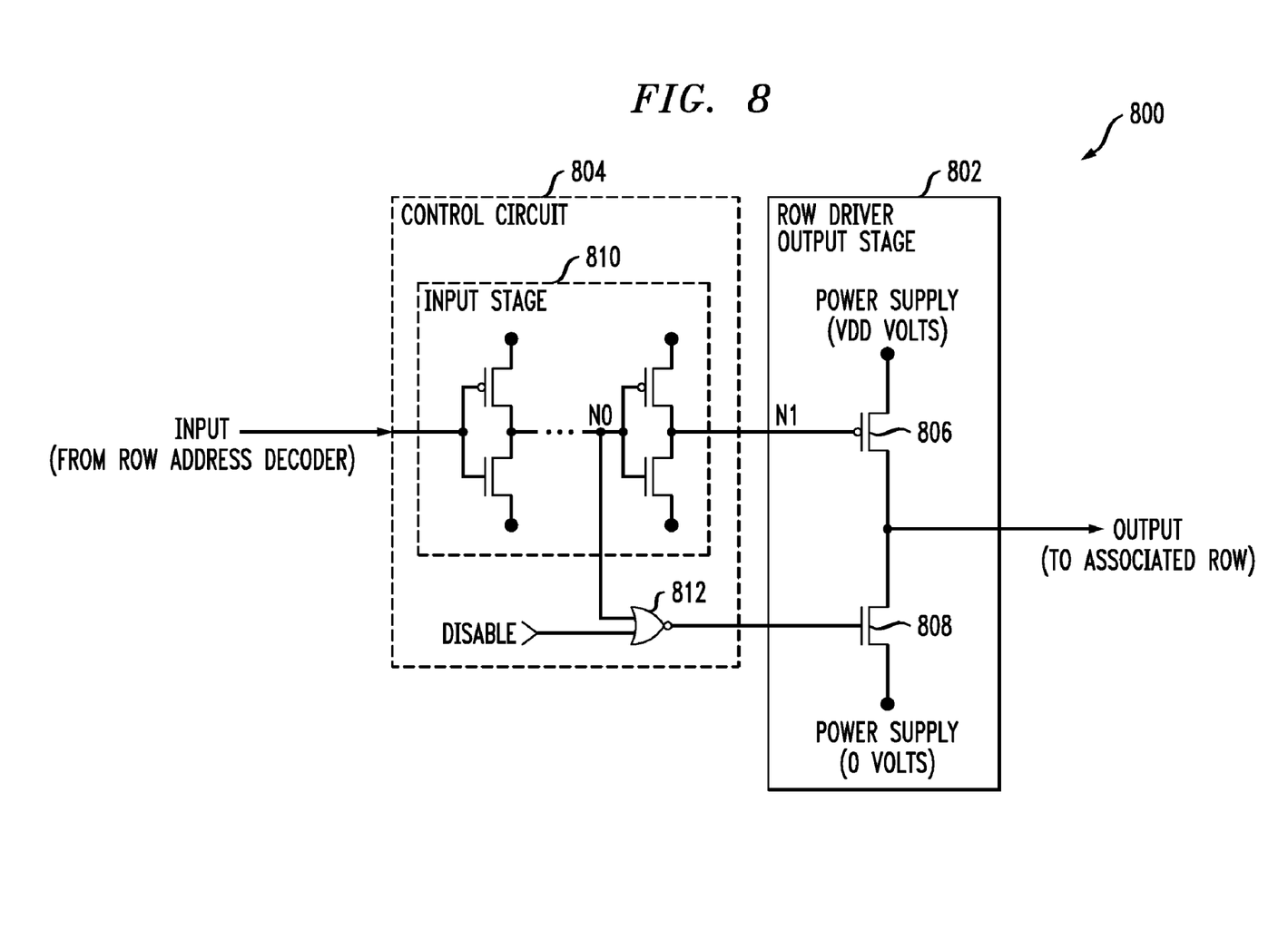
FIG. 8 is a schematic diagram depicting at least a portion of an exemplary row driver circuit, in accordance with another embodiment of the invention.

FIG. 8 is a schematic diagram depicting at least a portion of an exemplary row driver circuit 800, in accordance with another embodiment of the invention. Row line driver circuit 800 comprises an output stage 802 and a control circuit 804 connected to the output stage. The output stage 802 may be configured in a manner similar to output stage 702 depicted in FIG. 7. Specifically, output stage 802 preferably includes at least a first transistor device 806 connected in a pull-up path of the driver circuit 800 and at least a second transistor device 808 connected in a pull-down path of the driver circuit. The control circuit 804, like the control circuit 704 depicted in FIG. 7, is preferably operative at least during a substantial portion of an inactive phase of a given memory cycle to bias the first and second transistor devices in a non-conductive state at substantially the same time to thereby eliminate a leakage current path in the driver circuit.

Control circuit 804 is configured in a different manner compared to control circuit 704 shown in FIG. 7. More particularly, control circuit 804 includes an input stage 810 including a plurality of inverters connected together in series, although other input stage configurations are similarly contemplated. The invention is not limited to any specific number of inverters employed in the input stage 810. Input stage 810 is operative to receive as input a select signal from a row address decoder (e.g., 208 in FIG. 2) or alternative decode circuitry in a memory array in which driver circuit 800 is used, and to generate a buffered select signal at node N1 which is indicative of the input select signal. The buffered select signal may be either non-inverting or inverting relative to the input select signal, depending on the number of inverter stages employed in the input stage 810.

The control circuit 804 further includes a logical NOR gate 812, or alternative functional OR circuit, which functions as the disable circuit shown in FIG. 7, although in a slightly different manner. NOR gate 812 is operative to receive, at a first input, a Disable signal supplied to the control circuit 804. A second input of the NOR gate 812 is connected to an input of a last inverter in the input stage 810 at node N0. An output of the last inverter at node N1 generates the buffered select signal which is fed to a gate of device 806 for controlling the pull-up path of the output stage 802. An output of the NOR gate 812 is fed to a gate of device 808 for controlling the pull-down path of the output stage 802. Preferably, the NOR gate 812 is sized to have a propagation delay which is substantially matched to a propagation delay of the last inverter in the input stage. In this manner, the respective signals supplied to the gates of devices 806 and 808 will arrive concurrently.

When the Disable signal is a logic low level, as may occur during an active phase of the memory cycle, the signal applied to the gate of device 808 will be a function of the signal at node N0 of the input stage 810, which will be a logical complement of the signal applied to the gate of device 806. Hence, if node N0 is at a logic low level, NOR gate 812 will generate a logic high output, thereby turning on device 808 and pulling the output of the driver circuit 800 low (e.g., 0 volt). A logic low level at node N0 will produce a logic high level at node N1, thereby turning off device 806. Likewise, if node N0 is at a logic high level, NOR gate 812 will generate a logic low output, thereby turning off device 808. A logic high level at node N0 will produce a logic low level at node N1, thereby turning on device 806 and pulling the output of driver circuit 800 high (e.g., VDD). When the Disable signal is a logic high level, as may occur during the inactive phase of the memory cycle, the NOR gate 812 will generate a logic low level output, thereby turning off device 808 regardless of the state of the input select signal supplied to the driver circuit 800. Moreover, during the inactive phase of the memory cycle, the input select signal will be a logic low level and the signal at node N1 will be a logic high level, thereby turning off device 806.

Figure 9:
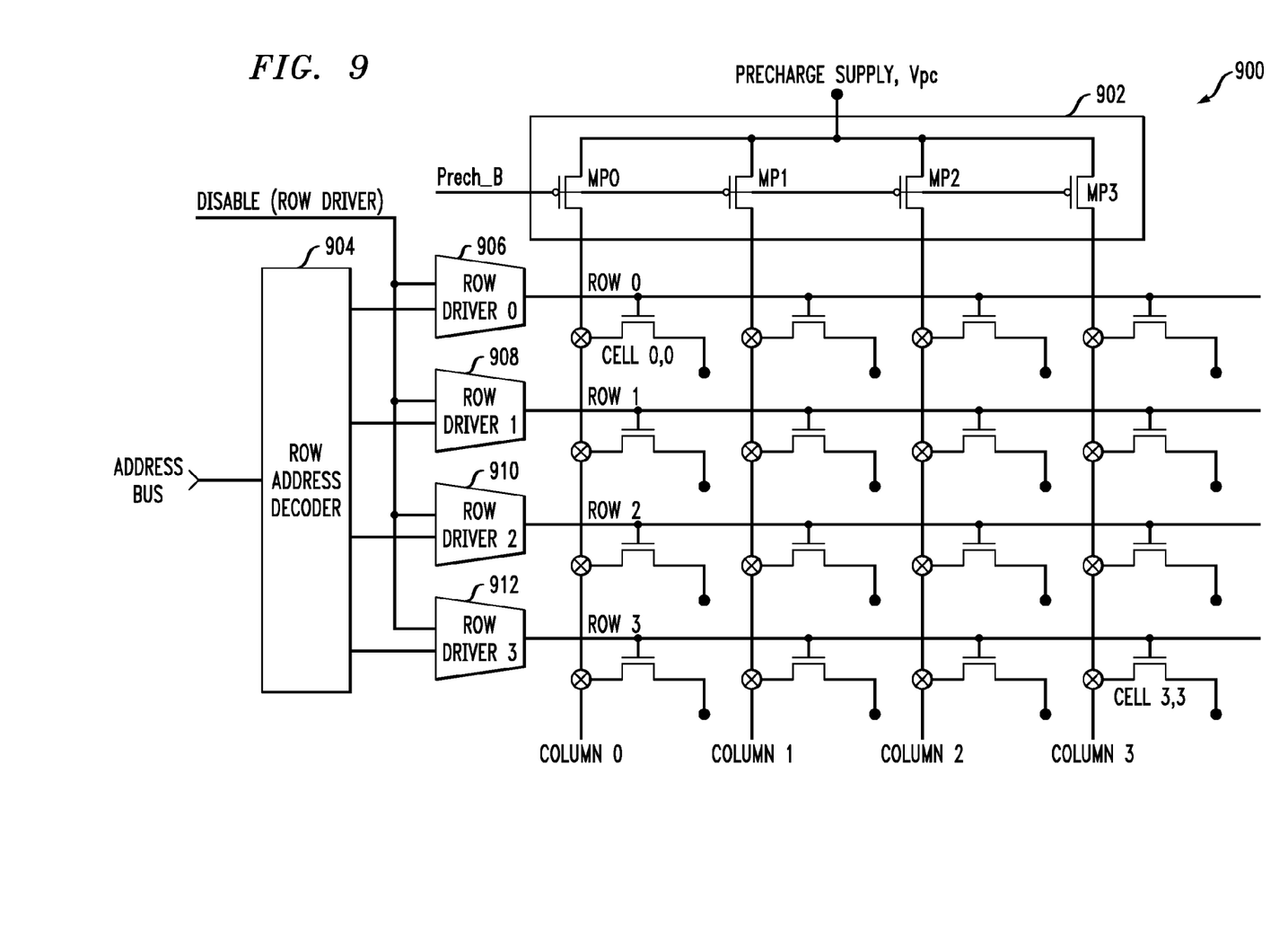
FIG. 9 is a schematic diagram depicting at least a portion of an exemplary memory circuit, in accordance with an embodiment of the invention.

FIG. 9 is a schematic diagram depicting at least a portion of an exemplary memory circuit 900, in accordance with an embodiment of the invention. Like memory circuit 200 shown in FIG. 2, memory circuit 900 includes a plurality of ROM cells, of which Cell 0,0 and Cell 3,3 are representative, a plurality of column lines, namely, Column 0, Column 1, Column 2 and Column 3, and a plurality of row lines, namely, Row 0, Row 1, Row 2 and Row 3. One or more of the ROM cells may be configured as shown in FIG. 1. Preferably, there is a ROM cell for each unique pair of column and row lines. For example, a corresponding pair of Column 0, Row 0 is connected to Cell 0,0 and is used for selectively accessing Cell 0,0. Likewise, a corresponding pair of Column 3, Row 3 is connected to Cell 3,3 and is used for selectively accessing Cell 3,3. Thus, a given ROM cell in memory circuit 200 may be referred to as Cell x,y, where x is an integer indicative of the column line to which the given ROM cell is connected and y is an integer indicative of the row line to which the given ROM cell is connected. It is to be understood that alternative naming conventions are similarly contemplated.

Although memory circuit 900 is illustrated as a 4×4 array (e.g., four column lines and four row lines), techniques of the invention may be employed with an array of any size N×M, where N is an integer indicative of the number of column lines in the array and M is an integer indicative of the number or row lines in the array. Moreover, although the column lines and row lines in memory circuit 900 are depicted as being substantially perpendicular to one another, with the column lines being arranged in a substantially vertical direction and the row lines being arranged in a substantially horizontal direction, the invention is not limited to any particular orientation of the column lines and row lines.

The column lines in memory circuit 900 are selectively precharged to a prescribed voltage, namely, a precharge supply voltage level, Vpc, via a precharge circuit 902. Precharge circuit 902 may be configured and/or function in a manner similar to precharge circuit 206 shown in FIG. 2. It is to be understood that alternative circuit arrangements for precharging the column lines are similarly contemplated, as will become apparent to those skilled in the art given the teachings herein. Precharge circuit 902 is preferably adapted to establish a potential on each of the column lines of a prescribed voltage level Vpc as a function of at least one control signal, Prech_B, supplied to the precharge circuit. The precharge voltage level is provided by the precharge supply, which may be generated internally with respect to precharge circuit 902, or supplied externally to the precharge circuit.

Memory circuit 900 further includes a row address decoder 904 operative to determine which one of the row lines (e.g., Row 0, Row 1, Row 2, or Row 3) is to be activated during the active phase of a particular memory cycle. Row address decoder 904 includes at least one control input for receiving one or more address signals (Address Bus), or other control signals, and a plurality of outputs generating respective select signals for selecting one of the row lines. When a plurality of address signals are employed, as may be supplied, for example, by an address bus (as shown), the row address decoder 904 will comprise a plurality of control inputs accordingly. Row address decoder 904 may comprise, for example, a multiplexer or alternative switching circuitry.

Each of the respective outputs of the row address decoder 904 is preferably connected to a corresponding row line via a corresponding row line driver circuit. More particularly, a first output of row address decoder 904 is connected to an input of a first row line driver circuit (Row Driver 0) 906 and an output of the first row line driver circuit is adapted for connection to corresponding row line Row 0. A second output of row address decoder 904 is connected to an input of a second row line driver circuit (Row Driver 1) 908 and an output of the second row line driver circuit is adapted for connection to corresponding row line Row 1. A third output of row address decoder 904 is connected to an input of a third row line driver circuit (Row Driver 2) 910 and an output of the third row line driver circuit is adapted for connection to corresponding row line Row 2. A fourth output of row address decoder 904 is connected to an input of a fourth row line driver circuit (Row Driver 3) 912 and an output of the fourth row line driver circuit is adapted for connection to corresponding row line Row 3. Only one of the plurality of output lines of the row address decoder 904 is activated at any given time, as a function of the address signals.

One or more of the row line driver circuits in memory circuit 900 may be implemented as shown in FIGS. 7 and 8, although alternative arrangements for the row line driver circuit are similarly contemplated. As apparent from the figure, row line driver circuits 906, 908, 910 and 912 are different than the row line driver circuits shown in FIG. 2 at least in that they include an additional control input, namely, a Disable input, which beneficially allows the row lines to float during at least the inactive phase of the memory cycle, as described herein above.

At least a portion of the apparatus and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An integrated circuit in accordance with the present invention can be employed in any application and/or electronic system which utilizes memory, embedded or otherwise. Suitable systems for implementing techniques of the invention may include, but are not limited, to personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A row line driver circuit for use in a memory array including a plurality of memory cells and a plurality of row lines coupled to the memory cells for selectively accessing the memory cells, the driver circuit comprising:

an output stage adapted for connection to a corresponding one of the row lines, the output stage being operative during an active phase of a given memory cycle to drive the corresponding one of the row lines to a potential as a function of at least one address signal received by the driver circuit; and a control circuit connected to the output stage, the control circuit being operative to generate at least one control signal for disabling the output stage at least during an inactive phase of the given memory cycle to thereby substantially eliminate a leakage current path in the driver circuit.

2. The row line driver circuit of claim 1, wherein the output stage is selectively disabled during at least a portion of the inactive phase of the given memory cycle as a function of the at least one control signal so that the corresponding one of the row lines has a floating potential associated therewith.

3. The row line driver circuit of claim 1, wherein the output stage comprises a PMOS device and an NMOS device, a first source/drain of the PMOS device being adapted for connection to a first voltage supply, a second source/drain of the PMOS device being connected to a first source/drain of the NMOS device at an output of the driver circuit and adapted for connection to the corresponding one of the row lines, a second source/drain of the NMOS device being adapted for connection to a second voltage supply, a gate of the PMOS device receiving a first control signal, and a gate of the NMOS device receiving a second control signal, the first and second control signals being operative at least during the inactive phase of the given memory cycle to bias the NMOS and PMOS devices in a non-conductive state at substantially the same time.

4. The row line driver circuit of claim 3, wherein the second control signal is a logical complement of the first control signal.

5. The row line driver circuit of claim 1, wherein the control circuit comprises:

an input stage operative to receive the at least one address signal and to generate a first signal indicative of the at least one address signal; and a disable circuit connected to the input stage, the disable circuit being operative: to receive at least a second signal; to generate the at least one control signal as a function of the second signal for disabling the output stage at least during an inactive phase of the given memory cycle; and to drive the corresponding one of the row lines to a prescribed potential during the active phase of the given memory cycle as a function of the first signal.

6. The row line driver circuit of claim 5, wherein the input stage comprises a plurality of inverters connected together in a series configuration.

7. The row line driver circuit of claim 5, wherein the disable circuit comprises a pass gate, first and second PMOS devices and first and second NMOS devices, a first source/drain of the first PMOS device being connected to a first source/drain of the first NMOS device and forming an input of the disable circuit for receiving the first signal, a second source/drain of the first PMOS device being connected to a first node of the pass gate, a second source/drain of the first NMOS device being connected to a second node of the pass gate, a first source/drain of the second PMOS device being adapted for connection to a first voltage supply, a second source/drain of the second PMOS device being connected to the first node of the pass gate and generating a first control signal for controlling a first transistor connected in a pull-up path of the driver circuit, a first source/drain of the second NMOS device being adapted for connection to a second voltage supply, a second source/drain of the second NMOS device being connected to the second node of the pass gate and generating a second control signal for controlling a second transistor connected in a pull-down path of the driver circuit, gates of the first PMOS device and second NMOS device receiving the second signal, gates of the first NMOS device and second PMOS device receiving a logical complement of the second signal, the pass gate being selectively controlled as a function of the second signal.

8. The row line driver circuit of claim 5, wherein the disable circuit comprises a functional OR gate having a first input for receiving the second signal, a second input connected to an input of a last one of the inverters in the input stage, an output of the last one of the inverters generating the first signal, and an output for generating the at least one control signal, and wherein the output stage comprises a first transistor connected in a pull-up path of the driver circuit and a second transistor connected in a pull-down path of the driver circuit, the first transistor being controlled as a function of the first signal and the second transistor being controlled as a function of the at least one control signal.

9. The row line driver circuit of claim 1, wherein the control circuit comprises:
an input stage including a first inverter and at least a second inverter, an input of the first inverter being adapted to receive the at least one address signal, an output of the first inverter being connected to an input of the second inverter, and an output of the second inverter generating a first control signal; and
a functional OR gate including a first input for receiving a disable signal, a second input connected to the input of the second inverter, and an output for generating a second control signal;
the output stage including a first transistor connected in a pull-up path of the driver circuit and a second transistor connected in a pull-down path of the driver circuit, the first transistor being controlled as a function of the first control signal and the second transistor being controlled as a function of the second control signal.

10. The row line driver circuit of claim 9, wherein a delay through the second inverter is substantially matched to a delay through the OR gate.

11. A row line driver circuit for use in a memory array including a plurality of memory cells and a plurality of row lines coupled to the memory cells for selectively accessing the memory cells, the driver circuit comprising:
an output stage adapted for connection to a corresponding one of the row lines, the output stage being operative during an active phase of a given memory cycle to drive the corresponding one of the row lines to a potential as a function of at least one address signal received by the driver circuit; and
a control circuit connected to the output stage, the control circuit being operative to generate at least one control signal for disabling the output stage at least during an inactive phase of the given memory cycle to thereby substantially eliminate a leakage current path in the driver circuit;
wherein the output stage comprises at least first and second transistors coupled to the corresponding one of the row lines, the first transistor being connected in a pull-up path of the driver circuit and the second transistor being connected in a pull-down path of the driver circuit, the control circuit being operative at least during the inactive phase of the given memory cycle to bias the first and second transistors in a non-conductive state at substantially the same time.

12. An integrated circuit including at least one row line driver circuit according to claim 1.

13. A memory circuit, comprising:
a plurality of memory cells;
a plurality of column lines and row lines connected to the memory cells for selectively accessing the memory cells as a function of a set of address signals supplied to the memory circuit, each of the memory cells being associated with a unique pair of column and row lines;
a decoder circuit operative to receive the set of address signals and to generate a plurality of select signals for selecting a given one of the row lines as a function of the set of address signals; and
a plurality of row line driver circuits, each of the row line driver circuits being connected to a corresponding one of the row lines, at least one of the driver circuits being operative during an active phase of a given memory cycle to drive the corresponding one of the row lines to a potential as a function of the set of address signals and being at least partially disabled at least during an inactive phase of the given memory cycle as a function of at least one control signal supplied to the memory circuit to thereby substantially eliminate a leakage current path in the driver circuit.

14. The memory circuit of claim 13, further comprising a precharge circuit connected to the plurality of column lines, the precharge circuit being operative to selectively charge the column lines to a prescribed potential during at least a portion of the inactive phase of the given memory cycle.

15. The memory circuit of claim 13, wherein at least one of the row line driver circuits comprises:
an output stage adapted for connection to the corresponding one of the row lines, the output stage being operative during the active phase of the given memory cycle to drive the corresponding one of the row lines to a potential as a function of the set of address signals; and
a control circuit connected to the output stage, the control circuit being operative to generate the at least one control signal for disabling the output stage at least during the inactive phase of the given memory cycle.

16. The memory circuit of claim 15, wherein the output stage comprises at least first and second transistors connected to an output of the driver circuit, the output being adapted for connection to the corresponding one of the row lines, the first transistor being connected in a pull-up path of the driver circuit and the second transistor being connected in a pull-down path of the driver circuit, the control circuit being operative at least during the inactive phase of the given memory cycle to bias the first and second transistors in a non-conductive state at substantially the same time.

17. The memory circuit of claim 15, wherein the output stage comprises a PMOS device and an NMOS device, a first source/drain of the PMOS device being adapted for connection to a first voltage supply, a second source/drain of the PMOS device being connected to a first source/drain of the NMOS device at an output of the driver circuit and adapted for connection to the corresponding one of the row lines, a second source/drain of the NMOS device being adapted for connection to a second voltage supply, a gate of the PMOS device receiving a first control signal, and a gate of the NMOS device receiving a second control signal, the first and second control signals being operative at least during the inactive phase of the given memory cycle to bias the NMOS and PMOS devices in a non-conductive state at substantially the same time.

18. The memory circuit of claim 15, wherein the control circuit comprises:
an input stage operative to receive the at least one address signal and to generate a first signal indicative of the at least one address signal; and
a disable circuit connected to the input stage, the disable circuit being operative: to receive at least a second signal; to generate the at least one control signal as a function of the second signal for disabling the output stage at least during an inactive phase of the given memory cycle; and to drive the corresponding one of the row lines to a prescribed potential during the active phase of the given memory cycle as a function of the first signal.

19. The memory circuit of claim 18, wherein the disable circuit comprises a pass gate, first and second PMOS devices and first and second NMOS devices, a first source/drain of the first PMOS device being connected to a first source/drain of the first NMOS device and forming an input of the disable circuit for receiving the first signal, a second source/drain of the first PMOS device being connected to a first node of the pass gate, a second source/drain of the first NMOS device being connected to a second node of the pass gate, a first source/drain of the second PMOS device being adapted for connection to a first voltage supply, a second source/drain of the second PMOS device being connected to the first node of the pass gate and generating a first control signal for controlling a first transistor connected in a pull-up path of the driver circuit, a first source/drain of the second NMOS device being adapted for connection to a second voltage supply, a second source/drain of the second NMOS device being connected to the second node of the pass gate and generating a second control signal for controlling a second transistor connected in a pull-down path of the driver circuit, gates of the first PMOS device and second NMOS device receiving the second signal, gates of the first NMOS device and second PMOS device receiving a logical complement of the second signal, the pass gate being selectively controlled as a function of the second signal.

20. The memory circuit of claim 18, wherein the disable circuit comprises a functional OR gate having a first input for receiving the second signal, a second input connected to an input of a last one of the inverters in the input stage, an output of the last one of the inverters generating the first signal, and an output for generating the at least one control signal, and wherein the output stage comprises a first transistor connected in a pull-up path of the driver circuit and a second transistor connected in a pull-down path of the driver circuit, the first transistor being controlled as a function of the first signal and the second transistor being controlled as a function of the at least one control signal.

21. The memory circuit of claim 15, wherein the control circuit comprises:
an input stage including a first inverter and at least a second inverter, an input of the first inverter being adapted to receive the at least one address signal, an output of the first inverter being connected to an input of the second inverter, and an output of the second inverter generating a first control signal; and
a functional OR gate including a first input for receiving a disable signal, a second input connected to the input of the second inverter, and an output for generating a second control signal;
the output stage including a first transistor connected in a pull-up path of the driver circuit and a second transistor connected in a pull-down path of the driver circuit, the first transistor being controlled as a function of the first control signal and the second transistor being controlled as a function of the second control signal.

22. A memory circuit, comprising:
a plurality of memory cells;
a plurality of row lines coupled to the memory cells for selectively accessing the memory cells; and
at least one row line driver circuit coupled to the plurality of row lines, the at least one row line driver circuit comprising:
an output stage adapted for connection to a corresponding one of the row lines, the output stage being operative during an active phase of a given memory cycle to drive the corresponding one of the row lines to a potential as a function of at least one address signal received by the driver circuit; and
a control circuit connected to the output stage, the control circuit being operative to generate at least one control signal for disabling the output stage at least during an inactive phase of the given memory cycle to thereby substantially eliminate a leakage current path in the driver circuit.

* * * * *